(12) United States Patent
Chen et al.

(10) Patent No.: US 11,830,543 B2
(45) Date of Patent: Nov. 28, 2023

(54) MEMORY COMPUTATION CIRCUIT

(71) Applicant: TAIWAN SEMICONDUCTOR MANUFACTURING COMPANY, LTD., Hsinchu (TW)

(72) Inventors: Yen-Huei Chen, Hsinchu (TW); Hidehiro Fujiwara, Hsinchu (TW); Hung-Jen Liao, Hsinchu (TW); Jonathan Tsung-Yung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/808,536

(22) Filed: Jun. 23, 2022

(65) Prior Publication Data

US 2022/0328096 A1 Oct. 13, 2022

Related U.S. Application Data

(60) Division of application No. 17/077,401, filed on Oct. 22, 2020, now Pat. No. 11,398,275, which is a continuation of application No. 16/405,822, filed on May 7, 2019, now Pat. No. 10,839,894.

(60) Provisional application No. 62/691,903, filed on Jun. 29, 2018.

(51) Int. Cl.
| | |
|---|---|
| *G11C 11/419* | (2006.01) |
| *G11C 11/412* | (2006.01) |
| *G06N 3/08* | (2023.01) |
| *G06F 17/16* | (2006.01) |
| *G11C 11/418* | (2006.01) |

(52) U.S. Cl.
CPC ............ *G11C 11/419* (2013.01); *G06F 17/16* (2013.01); *G06N 3/08* (2013.01); *G11C 11/412* (2013.01); *G11C 11/418* (2013.01)

(58) Field of Classification Search
CPC ... G11C 11/419; G11C 11/412; G11C 11/418; G11C 7/1006; G11C 11/54; G06F 17/16; G06N 3/08; G06N 3/063
USPC .......................................................... 356/156
See application file for complete search history.

(56) References Cited

U.S. PATENT DOCUMENTS

| | | | |
|---|---|---|---|
| 8,417,758 B1 * | 4/2013 | Rao .......................... | G06F 17/16 708/607 |
| 10,553,285 B2 | 2/2020 | Zamir et al. | |
| 10,642,922 B2 * | 5/2020 | Knag ....................... | G11C 11/54 |
| 10,879,904 B1 * | 12/2020 | Gunter .................... | G06N 3/063 |
| 11,409,352 B2 * | 8/2022 | Tran ........................ | G06F 1/3203 |
| 2016/0062947 A1 | 3/2016 | Chetlur et al. | |
| 2017/0103307 A1 * | 4/2017 | Henry ...................... | G06N 3/088 |

(Continued)

*Primary Examiner* — Fernando Hidalgo
(74) *Attorney, Agent, or Firm* — Hauptman Ham, LLP

(57) ABSTRACT

A memory circuit includes a first memory array including first memory cells wherein a plurality of first word lines is coupled with a plurality of rows of first memory cells in a first segment of the first memory array, and a plurality of second word lines is coupled with the plurality of rows of first memory cells in a second segment of the first memory array. The memory circuit also includes a read circuit configured to retrieve data from the first memory cells of the first memory array and a computation circuit configured to perform a matrix computation by combining first data retrieved from the first memory cells of the first segment with second data retrieved from the first memory cells of the second segment.

20 Claims, 8 Drawing Sheets

(56) References Cited

U.S. PATENT DOCUMENTS

| | | |
|---|---|---|
| 2017/0236578 A1 | 8/2017 | Campbell et al. |
| 2018/0004708 A1* | 1/2018 | Muralimanohar ...... H03M 1/12 |
| 2019/0065940 A1* | 2/2019 | Ross .................. G06F 15/8046 |
| 2020/0013436 A1 | 1/2020 | Hirose |
| 2022/0366255 A1* | 11/2022 | Ross .................. G06F 15/8046 |

* cited by examiner

600

| 610 | Receive input data at an input port of a memory circuit |

| 620 | Store a first subset of the input data in a first segment of a memory array and a second subset of the input data in a second segment of the memory array |

| 630 | Latch a first data bit from a first column of memory cells in one of the first segment of the memory array or the second segment of the memory array |

| 640 | Sequentially read a plurality of second data bits from a second column of memory cells in the other of the first segment or the second segment |

| 650 | Perform a logic operation on each combination of the latched first data bit and each second data bit |

| 660 | Repeat one or more or all of operations 630 through 650 |

| 670 | Calculate a sum by adding some or all of the results of performing the logic operation on each combination of the latched first data bit and each second data |

| 680 | Output the sum |

| 690 | Include the sum in an input to a layer of a network circuit |

FIG. 6

MEMORY COMPUTATION CIRCUIT

PRIORITY CLAIM

The present application is a divisional of U.S. patent application Ser. No. 17/077,401, filed Oct. 22, 2020, which is a continuation of U.S. patent application Ser. No. 16/405,822, filed May 7, 2019, now U.S. Pat. No. 10,839,894, issued Nov. 17, 2020, which claims the priority of U.S. Provisional Application No. 62/691,903, filed Jun. 29, 2018, which are incorporated herein by reference in their entireties.

BACKGROUND

Memory arrays are often used to store and access data used for various types of computations such as logic or mathematical operations. To perform these operations, data bits are moved between the memory arrays and circuits used to perform the computations. In some cases, computations include multiple layers of operations, and the results of a first operation are used as input data in a second operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of performing an in-memory computation, in accordance with some embodiments.

DETAILED DESCRIPTION

Figure 1:
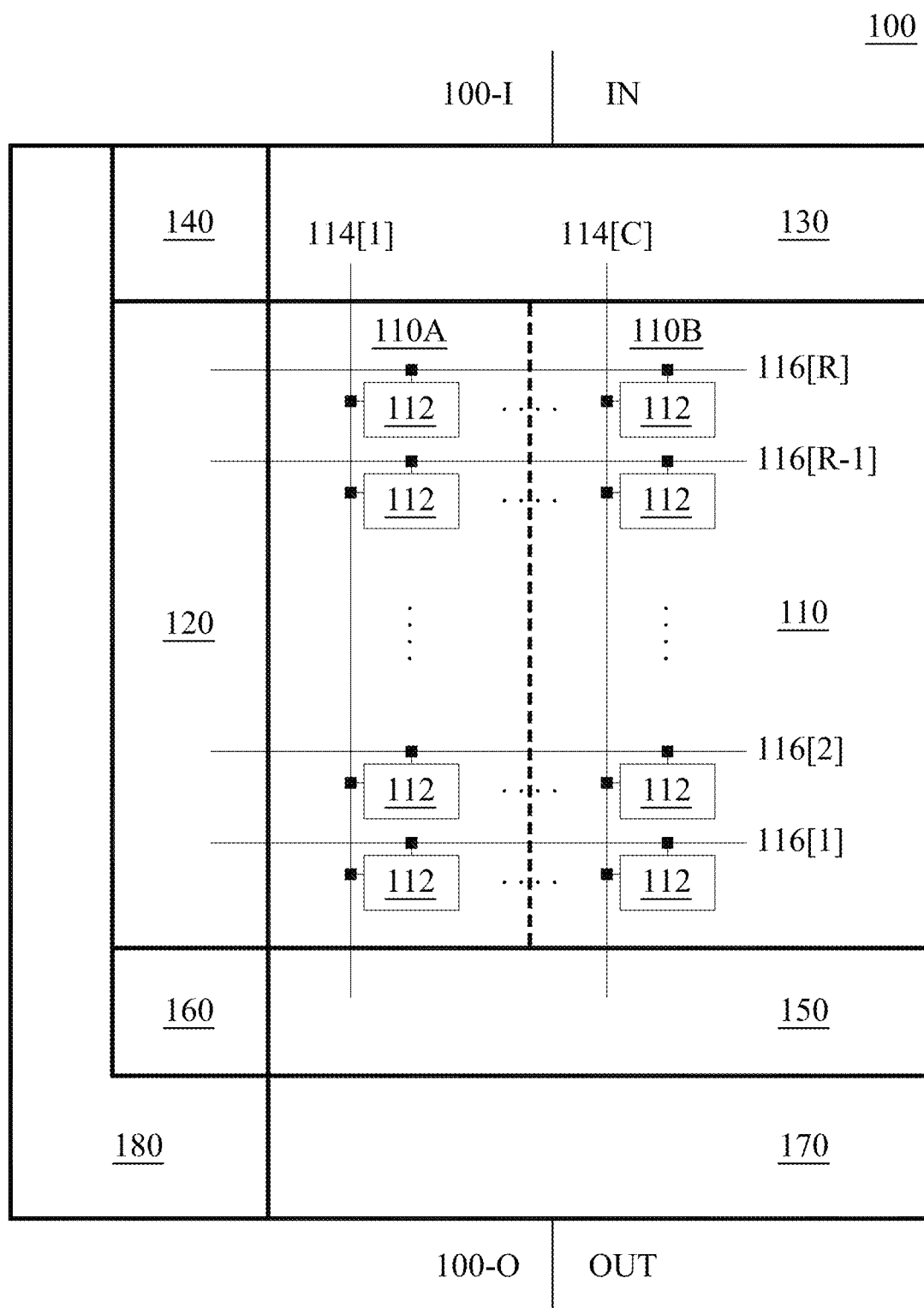
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a circuit includes a memory array positioned between a write circuit and a read circuit. The write circuit stores data in the memory array based on data received at an input port, and the read circuit retrieves stored data for a computation circuit that outputs result data to an output port. By performing this in-memory computation in which data flows from the input port to the output port, the circuit is capable of reducing data movement compared to approaches that do not perform such in-memory computations, particularly in cases in which the circuit is used in one or more layers of a network circuit such as a neural network.

In some embodiments, the circuit performs in-memory computations by operating at least one segment of the memory array separately from at least one other segment of the memory array, and is further capable of reducing data movement compared to approaches in which a circuit performs computations based on multiple memory arrays that do not operate segments separately.

FIG. 1 is a diagram of a memory circuit 100, in accordance with some embodiments. Memory circuit 100 includes a memory array 110, a row decode circuit 120, a write circuit 130, a write control circuit 140, a read circuit 150, a read control circuit 160, a computation circuit 170, and a control circuit 180.

Memory array 110 is positioned between and coupled with each one of write circuit 130 and read circuit 150. Read circuit 150 is positioned between and coupled with each one of memory array 110 and computation circuit 170. Write control circuit 140 is adjacent to and coupled with write circuit 130; row decode circuit 120 is adjacent to and coupled with memory array 110; and read control circuit 160 is adjacent to and coupled with read circuit 150.

In the embodiment depicted in FIG. 1, both write circuit 130 and write control circuit 140 are positioned at the top of memory array 110, and read circuit 150, read control circuit 160, and computation circuit 170 are positioned at the bottom of memory array 110. In some embodiments, both write circuit 130 and write control circuit 140 are positioned at the bottom of memory array 110, and read circuit 150, read control circuit 160, and computation circuit 170 are positioned at the top of memory array 110.

Row decode circuit 120 is positioned between and coupled with each one of write control circuit 140 and read control circuit 160. Control circuit 180 is coupled with each one of write control circuit 140, row decode circuit 120, read control circuit 160, and computation circuit 170. In some embodiments, control circuit 180 is not coupled with one or more of write control circuit 140, row decode circuit 120, read control circuit 160, or computation circuit 170.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

In the embodiment depicted in FIG. 1, control circuit 180 is adjacent to each one of write control circuit 140, row decode circuit 120, read control circuit 160, and computation circuit 170. In various embodiments, control circuit 180 is positioned apart from one or more of write control circuit 140, row decode circuit 120, read control circuit 160, or computation circuit 170, and/or control circuit 180 includes one or more of write control circuit 140, row decode circuit 120, read control circuit 160, or computation circuit 170.

In some embodiments, memory circuit 100 does not include control circuit 180, and one or more of row decode circuit 120, write control circuit 140, read control circuit 160, or computation circuit 170 is configured to receive one or more control signals (not shown) from one or more circuits, e.g., a processor 210 discussed below with respect to FIG. 2A, external to memory circuit 100.

Memory array 110 is an array of memory cells 112 arranged in rows and columns. In the embodiment depicted in FIG. 1, memory array 110 includes a segment 110A including one or more columns of memory cells 112, and a segment 110B including one or more columns of memory cells 112. In various embodiments, memory array 110 includes a single segment, or greater than two segments, each segment including one or more columns of memory cells 112. In some embodiments, memory array 110 includes one or more of memory array segments 310X[1] . . . 310X[N] and/or 310W[1] . . . 310W[N], discussed below with respect to FIG. 3.

In embodiments in which memory array 110 includes more than one segment, memory circuit 100 is configured to operate at least one segment separately from at least one other segment, as discussed below.

A memory cell 112 of memory array 110 includes electrical, electromechanical, electromagnetic, or other devices configured to store bit data represented by logical states.

Each column of a number C columns of memory cells 112 is coupled with a corresponding bit line of bit lines 114[1] . . . 114[C] through which the logical states are programmed in a write operation and detected in a read operation. Each row of a number R rows of memory cells 112 is coupled with a corresponding word line of word lines 116[1] . . . 116[R] through which the memory cell 112 is selected in the read and write operations.

In some embodiments, a logical state corresponds to a voltage level of an electrical charge stored in a given memory cell 112. In some embodiments, a logical state corresponds to a physical property, e.g., a resistance or magnetic orientation, of a component of a given memory cell 112.

In some embodiments, memory cells 112 include static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, memory cells 112 include dynamic random-access memory (DRAM) cells or other memory cell types capable of storing bit data. In some embodiments, memory cells 112 include memory cells 412X and 412W, discussed below with respect to FIG. 4.

Row decode circuit 120 is an electronic circuit configured to generate one or more word line signals (not labeled) on word lines 116[1] . . . 116[R] based on one or more control signals (not shown) received from control circuit 180 or from one or more circuits, e.g., processor 210 discussed below with respect to FIG. 2A, external to memory circuit 100. The one or more word line signals are capable of causing one or more memory cells 112 to become activated during read and write operations, thereby selecting the one or more memory cells 112 during a read or write operation.

In some embodiments, row decode circuit 120 is configured to select an entirety of a given row of memory cells 112 during a read or write operation. In some embodiments, during a read or write operation, row decode circuit 120 is configured to select one or more subsets of a given row of memory cells 112 by generating one or more subsets of word line signals on one or more subsets of word lines 116[1] . . . 116[R], memory circuit 100 thereby being configured in part to operate at least one segment, e.g., segment 110A, of memory array 110 separately from at least one other segment, e.g., segment 110B, of memory array 110.

In some embodiments, row decode circuit 120 includes row decode circuit 320 configured to generate one or more of word line signals WX[1] . . . WX[M] on word lines 316X[1] . . . 316X[M] or word line signals WW[1] . . . WW[M] on word lines 316W[1] . . . 316W[M], discussed below with respect to FIG. 3.

Write circuit 130 is an electronic circuit configured to generate voltage levels corresponding to logical states on bit lines 114[1] . . . 114[C] during a write operation, the one or more memory cells 112 selected during the write operation thereby being programmed to logical states based on the voltage levels on bit lines 114[1] . . . 114[C]. In the embodiment depicted in FIG. 1, each memory cell 112 is coupled with a single one of bit lines 114[1] . . . 114[C], and write circuit 130 is configured to output a single voltage level on the single one of bit lines 114[1] . . . 114[C] corresponding to a given memory cell 112. In some embodiments, each memory cell 112 is coupled with a pair of bit lines of bit lines 114[1] . . . 114[C], and write circuit 130 is configured to output complementary voltage levels on the pair of bit lines of bit lines 114[1] . . . 114[C] corresponding to a given memory cell 112.

Write circuit 130 is configured to generate the voltage levels based on data IN received at an input port 100-I, and on one or more control signals (not shown) received from write control circuit 140 or from one or more circuits, e.g., processor 210 discussed below with respect to FIG. 2A, external to memory circuit 100.

A port, e.g., input port 100-I, is a plurality of electrical connections configured to conduct one or more signals, e.g., data IN, in and/or out of a circuit or portion of a circuit. Data IN includes a plurality of voltage levels, each voltage level being carried on one or more electrical connections of input port 100-I and corresponding to a logical state of a data bit of data IN.

In some embodiments, write circuit 130 is configured to generate the one or more voltage levels for an entirety of the columns of memory cells 112 during a write operation. In some embodiments, during a write operation, write circuit 130 is configured to write to one or more subsets of the columns of memory cells 112, memory circuit 100 thereby being configured in part to operate at least one segment, e.g., segment 110A, of memory array 110 separately from at least one other segment, e.g., segment 110B, of memory array 110.

In some embodiments, memory circuit 100 is configured so that write circuit 130 writes to the one or more subsets of the columns of memory cells 112 based on the one or more subsets of the columns of memory cells 112 being activated by row decoder 120 during a write operation as discussed above. In some embodiments, write circuit 130 is configured to write to one or more subsets of the columns of memory cells 112 by masking one or more portions of data IN during a write operation.

Write control circuit 140 is an electronic circuit configured to generate and output the one or more control signals to write circuit 130 based on one or more control signals (not shown) received from control circuit 180 or from one or more circuits, e.g., processor 210 discussed below with respect to FIG. 2A, external to memory circuit 100.

Read circuit 150 is an electronic circuit configured to receive voltage signals (not labeled) on one or more of bit lines 114[1] . . . 114[C] during a read operation, the voltage signals being based on the logical states of the one or more memory cells 112 selected during the read operation. Read circuit 150 is configured to determine the logical states of the one or more memory cells 112 selected during the read operation based on the voltage signals on the one or more of bit lines 114[1] . . . 114[C]. In some embodiments, read circuit 150 includes one or more sense amplifiers, e.g., sense amplifier SA discussed below with respect to FIG. 3, configured to determine the logical states of the one or more memory cells 112.

In the embodiment depicted in FIG. 1, each memory cell 112 is coupled with a single bit line of bit lines 114[1] . . . 114[C], and read circuit 150 is configured to determine the logical state of a given memory cell 112 based on the voltage signal on the single bit line of bit lines 114[1] . . . 114[C] corresponding to the given memory cell 112. In some embodiments, each memory cell 112 is coupled with a pair of bit lines of bit lines 114[1] . . . 114[C], and read circuit 150 is configured to determine the logical state of a given memory cell 112 based on the voltage signals on the pair of bit lines of bit lines 114[1] . . . 114[C] corresponding to the given memory cell 112.

Read circuit 150 is configured to generate one or more data signals (not shown) based on the determined logical states of memory cells 112, and on one or more control signals (not shown) received from read control circuit 160.

In some embodiments, read circuit 150 is configured to generate the one or more data signals based on an entirety of the columns of memory cells 112 during a read operation. In some embodiments, during a read operation, read circuit 150 is configured to generate one or more data signals based on one or more subsets of the columns of memory cells 112, memory circuit 100 thereby being configured in part to operate at least one segment, e.g., segment 110A, of memory array 110 separately from at least one other segment, e.g., segment 110B, of memory array 110. In some embodiments, read circuit 150 is configured to generate one or more data signals based on one or more subsets of the columns of memory cells 112 by masking one or more voltage signals on bit lines 114[1] . . . 114[C] during a read operation.

In some embodiments, memory circuit 100 is configured so that read circuit 150 generates one or more data signals based on the one or more subsets of the columns of memory cells 112 being activated by row decoder 120 during a read operation as discussed above. In some embodiments, read circuit 150 includes read circuit 350 configured to generate data signals X[1] . . . X[N] and W[1] . . . W[N], discussed below with respect to FIG. 3.

Read control circuit 160 is an electronic circuit configured to generate and output the one or more control signals to read circuit 150 based on one or more control signals (not shown) received from control circuit 180 or from one or more circuits, e.g., processor 210 discussed below with respect to FIG. 2A, external to memory circuit 100.

Computation circuit 170 is an electronic circuit configured to receive the one or more data signals from read circuit 150, and perform one or more logical and/or mathematical operations based on the one or more data signals and one or more control signals (not shown) received from control circuit 180 or from one or more circuits, e.g., processor 210 discussed below with respect to FIG. 2A, external to memory circuit 100.

In some embodiments, memory circuit 100 is configured so that one or more logical and/or mathematical operations performed by computation circuit 170 are coordinated with one or more operations performed by read circuit 150, memory circuit 100 thereby being configured to perform an in-memory computation. In some embodiments, memory circuit 100 is configured so that computation circuit 170 performs one or more logical and/or mathematical operations in a sequence coordinated with a sequence by which read circuit 150 determines logical states of memory cells 112. In some embodiments, memory circuit 100 is configured so that read circuit 150 and computation circuit 170 operations are coordinated to perform a matrix computation as discussed below with respect to the non-limiting examples of FIGS. 2C and 5.

In some embodiments, computation circuit 170 is configured to perform the one or more logical functions based on performing a first operation on a first subset of the one or more data signals and performing a second operation on a second subset of the one or more data signals, memory circuit 100 thereby being configured in part to operate at least one segment, e.g., segment 100A, of memory array 110 separately from at least one other segment, e.g., segment 110B, of memory array 110.

In some embodiments, computation circuit 170 is configured to perform a matrix computation using the first subset of the one or more data signals as input data and the second subset of the one or more data signals as weight data. In some embodiments, computation circuit 170 includes a multiplier-accumulator configured to perform a multiply-accumulate operation. In some embodiments, computation circuit 170 includes operation circuit 370A and addition circuit 370B, discussed below with respect to FIG. 3.

Computation circuit 170 is configured to output data OUT on an output port 100-O. Data OUT includes a plurality of voltage levels, each voltage level being carried on one or more electrical connections of output port 100-O. In various embodiments, data OUT includes a same, greater, or lesser number of voltage levels as a number of voltage levels included in data IN.

The plurality of voltage levels of data OUT are based on one or more results of the one or more logical and/or mathematical operations. In some embodiments, one or more voltage levels are based on one or more results of a logical or mathematical operation performed by computation circuit 170 on two or more data bits stored in memory array 110 and retrieved by read circuit 150. In various embodiments, memory circuit 100 is configured to generate data OUT including none, one or more, or all of the plurality of voltage levels of data OUT representing a logical state of a memory cell 112 in memory array 110.

In the embodiment depicted in FIG. 1, memory array 110 is positioned between input port 100-I at the top of memory circuit 100 and output port 100-O at the bottom of memory circuit 100. In some embodiments in which write circuit 130 and write control circuit 140 are positioned at the bottom of memory array 110, and read circuit 150, read control circuit 160, and computation circuit 170 are positioned at the top of memory array 110, memory array 110 is positioned between input port 100-I at the bottom of memory circuit 100 and output port 100-O at the top of memory circuit 100. In various embodiments, memory array 110 is positioned between input port 100-I and output port 100-O based on one or both of input port 100-I or output port 100-O being positioned at a side or sides of memory circuit 100.

By the configuration discussed above, memory circuit 100, in operation, is capable of receiving data IN at input port 100-I, storing logical states based on data IN, performing one or more logical functions based on the stored logical states, and generating data OUT at output port 100-O. Memory circuit 100 is thereby configured to perform an in-memory computation in which data flows in the direction determined by the positioning of input port 100-I and output port 100-O.

By including separately positioned input and output ports and in-memory computation, memory circuit 100 is capable of being included in circuits in which data movement distances are reduced compared to approaches in which a memory circuit does not include one or both of separately positioned input and output ports or in-memory computation. By reducing data movement distances, memory circuit 100 enables reduced power and simplified circuit configurations by reducing parasitic capacitances associated with data bus lengths and/or numbers of data buffers compared to approaches in which a memory circuit does not include one or both of separately positioned input and output ports or in-memory computation.

In some embodiments in which memory circuit 100 is configured to perform in-memory computation by operating at least one segment of memory array 110 separately from at least one other segment of memory array 110, memory circuit 100 is further capable of reducing data movement distances compared to approaches in which a memory circuit includes multiple memory arrays that do not include in-memory computation or segmented arrays.

Figure 2A:
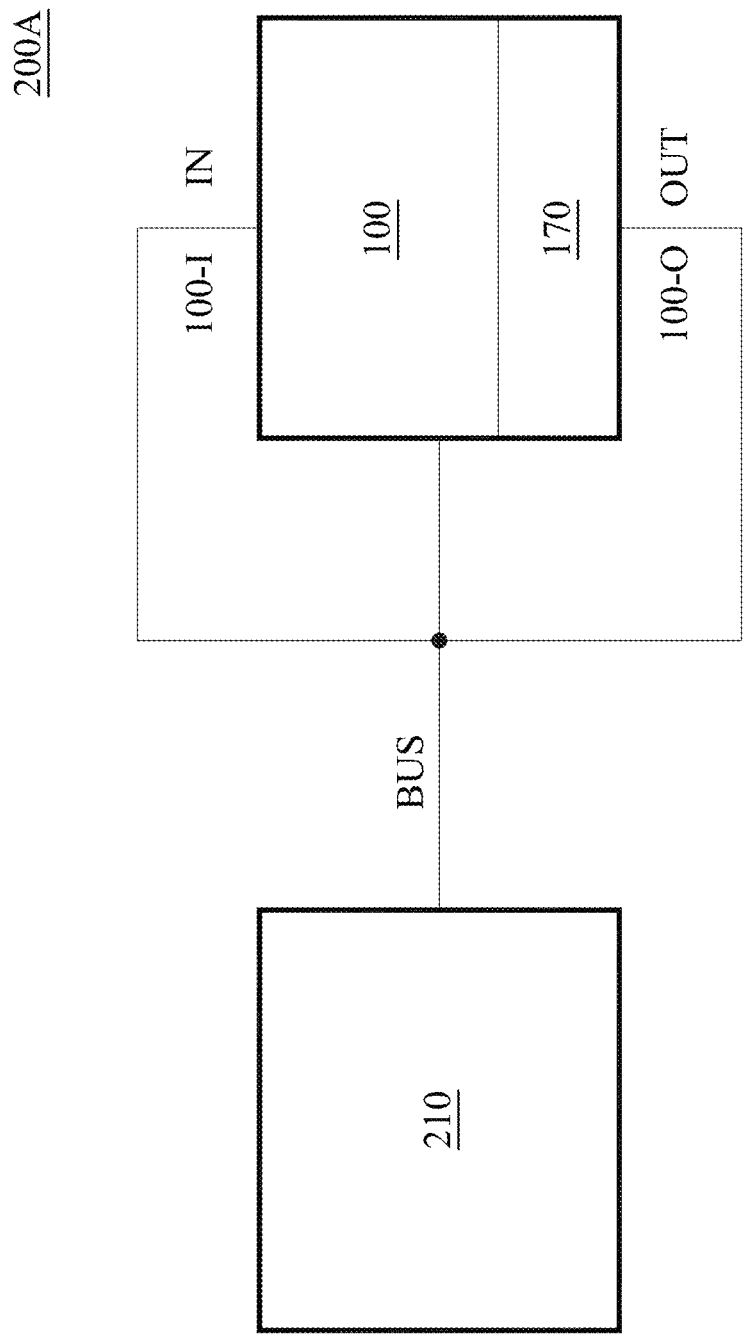
FIG. 2A is a diagram of a system, in accordance with some embodiments.

FIG. 2A is a diagram of a system 200A, in accordance with some embodiments. System 200A includes memory circuit 100, discussed above with respect to FIG. 1, and a processor 210. Processor 210 is an electronic circuit configured to perform one or more logic operations and is coupled with memory circuit 100 through a data bus BUS.

System 200A is an electronic or electromechanical system configured to perform one or more predetermined functions based on the one or more logic operations performed by processor 210 and on data and in-memory computation operations performed by memory circuit 100 including computation circuit 170, as discussed above with respect to FIG. 1. In various embodiments, system 200A is configured to perform one or more functions, e.g., a feed-forward or multiply-accumulate function, of a neural network.

In some embodiments, system 200A includes one or more circuits (not shown) in addition to memory circuit 100 and processor 210. In some embodiments, system 200A includes a network circuit, e.g., network circuit 200B discussed below with respect to FIG. 2B, that includes a plurality of memory circuits 100.

Data bus BUS is a plurality of electrical connections configured to conduct one or more signals between memory circuit 100 and processor 210. Data bus BUS is coupled with input port 100-I and output port 100-O of memory circuit 100 and is thereby configured to conduct one or both of data IN from processor 210 to memory circuit 100 or data OUT from memory circuit 100 to processor 210.

In some embodiments, data bus BUS is further coupled with memory circuit 100 and is thereby configured to conduct one or more control or other signals (not shown) between memory circuit 100 and processor 210.

By the configuration discussed above, system 200A including memory circuit 100 is capable of realizing the benefits discussed above with respect to memory circuit 100.

Figure 2B:
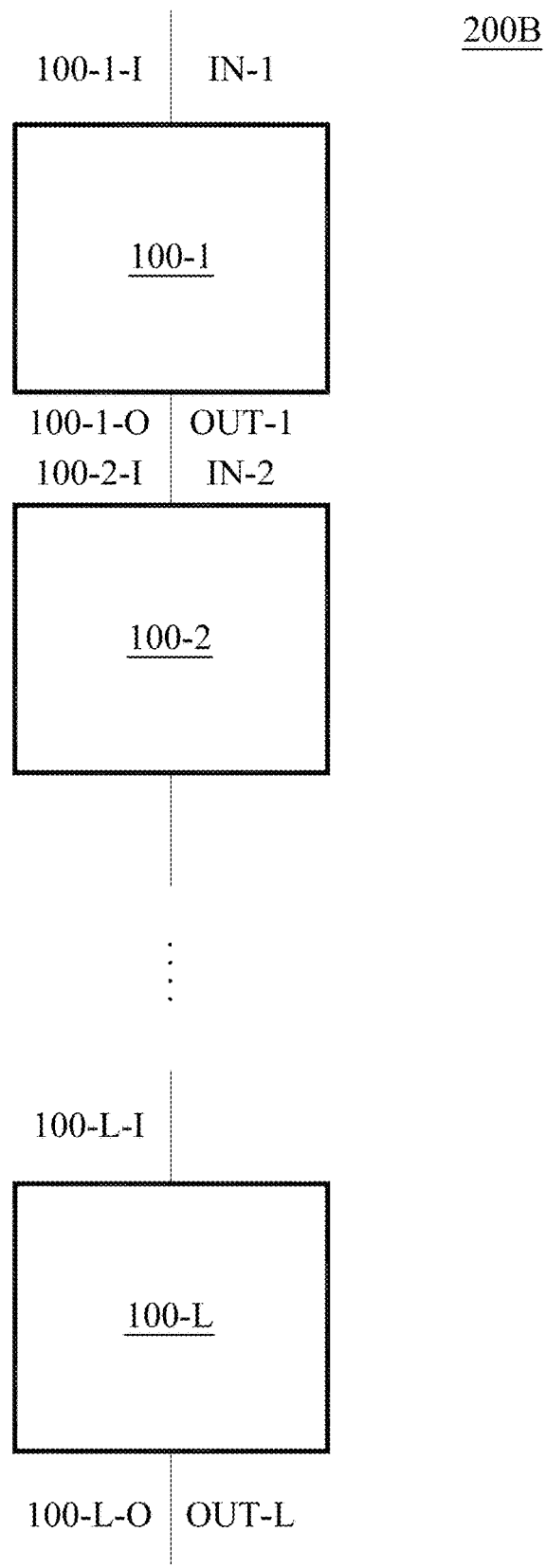
FIG. 2B is a diagram of a network circuit, in accordance with some embodiments.

FIG. 2B is a diagram of a network circuit 200B, in accordance with some embodiments. Network circuit 200B includes multiple layers of memory circuits 100, discussed above with respect to FIG. 1.

Network circuit 200B includes a number L of layers of memory circuits 100 labeled 100-1 through 100-L, the layers including respective input ports 100-1-I through 100-L-I and output ports 100-1-O through 100-L-O. Input port 100-1-I is an input port of network circuit 200B, and output port 100-L-O is an output port of network circuit 200B.

Output port 100-1-O is coupled with input port 100-2-I, and output port 100-2-O is coupled with the input port of the adjacent layer (not shown), the pattern being repeated through input port 100-L-I such that data paths from input port 100-1-I to output port 100-L-O include each one of memory circuits 100-1 through 100-L.

By the configuration discussed above, in operation, memory circuit 100-1 receives data IN-1 at input port 100-1-I and outputs data OUT-1 on output port 100-1-O, and memory circuit 100-2 receives data OUT-1 as data IN-2 at input port 100-2-I and outputs data OUT-2 on output port 100-2-O, the pattern being repeated such that data flows from input port 100-1-I to output port 100-L-O through each one of memory circuits 100-1 through 100-L.

In the embodiment depicted in FIG. 2B, network circuit 200B includes the number L layers of memory circuits 100 equal to three. In various embodiments, network circuit 200B includes the number L layers of memory circuits 100 fewer or greater than three.

In the embodiment depicted in FIG. 2B, input ports 100-1-I through 100-L-I are positioned at the tops of respective memory circuits 100-1 through 100-L, and output ports 100-1-O through 100-L-O are positioned at the bottoms of respective memory circuits 100-1 through 100-L, so that, in operation, data flows from input port 100-1-I at the top of network circuit 200B to output port 100-L-O at the bottom of network circuit 200B. In some embodiments, input ports 100-1-I through 100-L-I are positioned at the bottoms of respective memory circuits 100-1 through 100-L, and output ports 100-1-O through 100-L-O are positioned at the tops of respective memory circuits 100-1 through 100-L, so that, in operation, data flows from input port 100-1-I at the bottom of network circuit 200B to output port 100-L-O at the top of network circuit 200B.

In various embodiments, one or more subsets of input ports 100-1-I through 100-L-I and/or one or more subsets of output ports 100-1-O through 100-L-O are positioned on respective memory circuits 100-1 through 100-L at one or more locations other than those depicted in FIG. 2B so that, in operation, data flows in more than one direction within network circuit 200B. In some embodiments, network circuit 200B includes memory circuits 100-1 through 100-L arranged in multiple rows and/or columns so that, in operation, data flows in a multi-directional pattern, e.g., a serpentine pattern, within network circuit 200B.

In various embodiments, the input and output ports of each layer of network circuit 200B have a same number of electrical connections, or at least one pair of input and output ports of adjacent layers of network circuit 200B has one or more numbers of electrical connections different from one or more numbers of electrical connections of one or more other pairs of input and output ports of adjacent layers of network circuit 200B.

In various embodiments, the memory circuits 100 of each layer of network circuit 200B are configured to output and receive data having a same number of data bits, or at least one pair of memory circuits 100 of adjacent layers of network circuit 200B is configured to output and receive data having a number of data bits different from a number of data bits of data output and received by one or more other pairs of memory circuits 100 of adjacent layers of network circuit 200B.

In some embodiments, the data output on an output port of a memory circuit 100 of a given layer of network circuit 200B is the same data as the data received at the input port of the memory circuit of the corresponding adjacent layer of network circuit 200B. In various embodiments, one or more of the data output from a given layer is a subset or a superset of the data received at the corresponding adjacent layer, the data output from a given layer includes data received by a circuit, e.g., processor 210 discussed above with respect to FIG. 2A, other than the corresponding adjacent layer, or the data received at the corresponding adjacent layer includes data output from a circuit, e.g., processor 210 discussed above with respect to FIG. 2A, other than the given layer.

Because each one of memory circuits 100-1 through 100-L includes computation circuit 170, discussed above with respect to FIG. 1, and network circuit 200B includes memory circuits 100-1 through 100-L configured as discussed above, network circuit 200B is configured to perform a series of computations in which the computational results of each one of memory circuits 100-1 through 100-(L−1) are included in one or more computations performed by each one of corresponding memory circuits 100-2 through 100-L. Network circuit 200B is thereby configured to perform a layered computational operation based on data received at input port 100-1-I and to output the results of the layered computational operation on output port 100-L-O.

In some embodiments, network circuit 200B includes at least one memory circuit 100 configured to operate at least one segment of memory array 110 separately from at least one other segment of memory array 110. In some embodiments, e.g., a neural network circuit 200C discussed below with respect to FIG. 2C, network circuit 200B includes at least one memory circuit 100 including computation circuit 170 configured to perform a matrix computation using data stored in segment 110A of memory array 110 as input data and data stored in segment 110B of memory array 110 as weight data.

By the configuration discussed above, data movement distances in network circuit 200B are reduced compared to approaches in which a network circuit does not include memory circuits 100 such that data flows in a given direction and in which in-memory computation is performed within the data flow. By reducing data movement distances, network circuit 200B enables reduced power and simplified circuit configurations compared to approaches in which a network circuit does not include memory circuits that include one or both of separately positioned input and output ports or in-memory computation, as discussed above with respect to memory circuit 100.

In some embodiments in which network circuit 200B includes at least one memory circuit 100 configured to perform in-memory computation by operating at least one segment, e.g., segment 110A, of memory array 110 separately from at least one other segment, e.g., segment 110B, of memory array 110, network circuit 200B is further capable of reducing data movement distances compared to approaches in which a network circuit includes multiple memory arrays that do not include in-memory computation or segmented arrays.

Figure 2C:
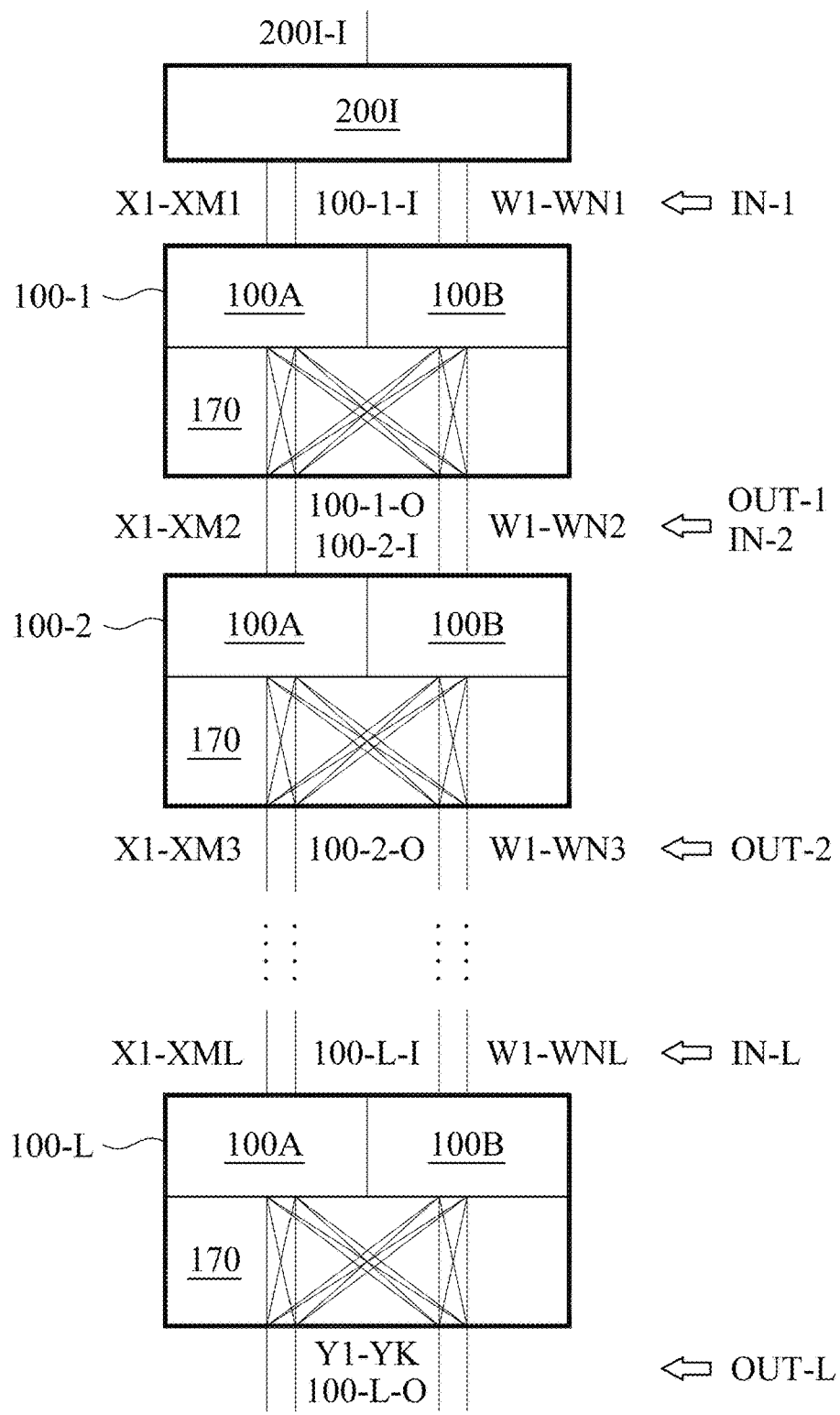
FIG. 2C is a diagram of a neural network circuit, in accordance with some embodiments.

FIG. 2C is a diagram of neural network circuit 200C, in accordance with some embodiments. Neural network circuit 200C is a non-limiting example of network circuit 200B, discussed above with respect to FIG. 2B, in which L−1 layers of memory circuits 100 are configured as hidden layers of a deep learning neural network.

Neural network circuit 200C includes memory circuits 100-1 through 100-L, discussed above with respect to FIG. 2B, and an input layer 200I coupled with input port 100-1-I of memory circuit 100-1. Input layer 200I includes an input port 200I4 of neural network circuit 200C, and memory circuit 100-L is configured as an output layer of neural network circuit 200C by including output port 100-L-O configured as an output port of neural network circuit 200C.

In neural network circuit 200C, each of memory circuits 100-1 through 100-L includes segments 110A and 110B, and computation circuit 170 configured to perform one or more matrix computations on data signals based on segments 110A and 110B, as discussed above with respect to FIG. 1. The one or more matrix computations are represented in FIG. 2C as intersecting line segments in each instance of computation circuit 170.

In some embodiments, the instances of computation circuit 170 are configured to perform a same one or more matrix computations on a same portion or all of the data signals based on segments 110A and 110B. In various embodiments, the instances of computation circuit 170 are configured so that at least one instance of computation circuit 170 is configured to perform one or more matrix computations different from one or more matrix computations performed based on a configuration of at least one other instance of computation circuit 170. In various embodiments, the instances of computation circuit 170 are configured so that at least one instance of computation circuit 170 is configured to perform one or more matrix computations on a portion or all of the data signals different from a portion or all of the data signals on which one or more matrix computations are performed based on a configuration of at least one other instance of computation circuit 170.

Input layer 200I is an electronic circuit configured to receive one or more data and/or control signals and, responsive to the one or more data and/or control signals, output data IN-1 to input port 100-1-I. Data IN-1 includes a number M1 of input data bits X1-XM1 and a number N1 of weight data bits W1-WN1.

Memory circuit 100-1 is configured to store bit data corresponding to input data bits X1-XM1 in segment 110A and bit data corresponding to weight data bits W1-WN1 in segment 110B, perform the one or more matrix computations by combining the data stored in segment 110A with the data stored in segment 110B, and output data OUT-1 to output port 100-1-O. Data OUT-1 includes a number M2 of input data bits X1-XM2 and a number N2 of weight data bits W1-WN2.

Memory circuit 100-2 is configured to receive data OUT-1 as data IN-2 at input port 100-2-I, store bit data corresponding to input data bits X1-XM2 in segment 110A and bit data corresponding to weight data bits W1-WN2 in segment 110B, perform the one or more matrix computations by combining the data stored in segment 110A with the data stored in segment 110B, and output data OUT-2 to output port 100-2-O. Data OUT-2 includes a number M3 of input data bits X1-XM3 and a number N3 of weight data bits W1-WN3.

Memory circuit 100-L is configured to receive data IN-L at input port 100-L-I, store bit data corresponding to input data bits X1-XML in segment 110A and bit data corresponding to weight data bits W1-WNL in segment 110B, perform the one or more matrix computations by combining the data stored in segment 110A with the data stored in segment 110B, and output data OUT-L to output port 100-L-O. Data OUT-L includes a number K of data bits Y1-YK.

In some embodiments, numbers M1-M(L−1) are a same number of input data bits and numbers N1-N(L−1) are a same number of weight data bits. In various embodiments, at least one of numbers M1-M(L−1) is different from at least one other of numbers M1-M(L−1) and/or at least one of numbers N1-N(L−1) is different from at least one other of numbers N1-N(L−1). In various embodiments the number K of data bits Y1-YK is the same as or different from at least one of numbers M1-M(L−1) and/or numbers N1-N(L−1).

By the configuration discussed above, in operation, memory circuit 100-1 performs a matrix computation on input data bits X1-XM1 and weight data bits W1-WN1 to generate input data bits X1-XM2 and weight data bits W1-WN2, and memory circuit 100-2 performs a matrix computation on input data bits X1-XM2 and weight data bits W1-WN2 to generate input data bits X1-XM3 and weight data bits W1-WN3, the pattern being repeated such that data flows from input port 100-1-I to output port 100-L-O through each one of memory circuits 100-1 through 100-L.

Because neural network circuit 200C includes input layer 200I between input port 200I4 and memory circuit 100-1, and memory circuit 100-(L−1) is separated from output port 100-L-O by memory circuit 100-L configured as an output layer, memory circuits 100-1 through 100-(L−1) are sometimes referred to as hidden layers of neural network circuit 200C.

In some embodiments, neural network circuit 200C is included in a neural network, and each layer of neural network circuit 200C is a layer of the neural network. In some embodiments, each hidden layer of neural network circuit 200C is a multiplier-accumulator layer of a feed-forward neural network.

A neural network that includes neural network circuit 200C, including memory circuits 100-1 through 100-L configured as discussed above, is thereby capable of realizing the benefits discussed above with respect to network circuit 200B.

Figure 3:
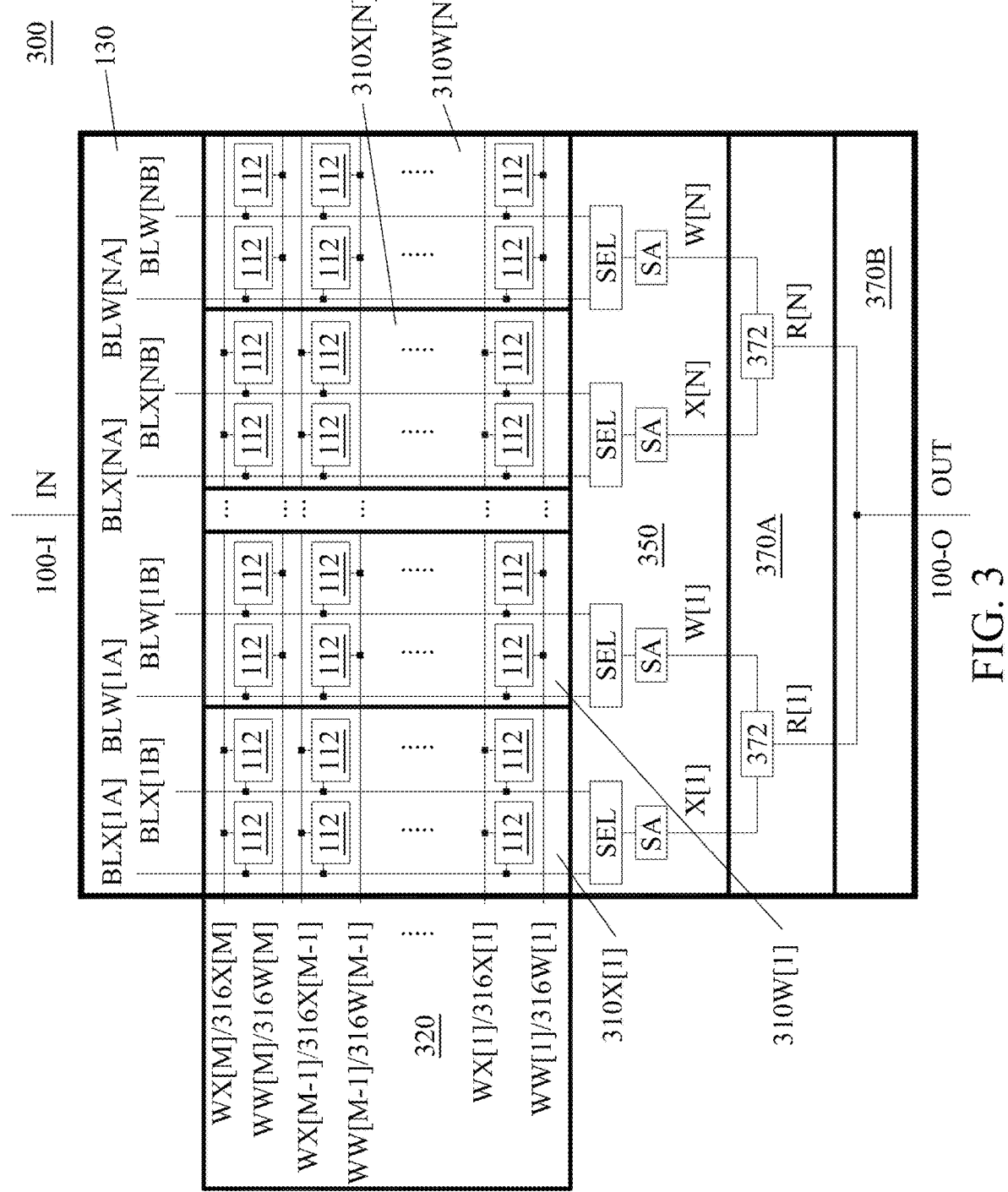
FIG. 3 is a diagram of a memory circuit, in accordance with some embodiments.

FIG. 3 is a diagram of a memory circuit 300, in accordance with some embodiments. Memory circuit 300 is usable as a portion of memory circuit 100, discussed above with respect to FIG. 1.

Memory circuit 300 includes memory array segments 310X[1] . . . 310X[N] and 310W[1] . . . 310W[N] usable as all or a portion of memory array 110 including segments 110A and 110B, a row decode circuit 320 usable as all or a portion of row decode circuit 120, write circuit 130, a read circuit 350 usable as all or a portion of read circuit 150, and operation circuit 370A and addition circuit 370B, collectively usable as all or a portion of computation circuit 170, as discussed above with respect to FIG. 1.

Each one of memory array segments 310X[1] . . . 310X[N] and 310W[1] . . . 310W[N] corresponds to a segment 110A or 110B and includes at least one column of memory cells 112 coupled with a bit line of bit lines BLX[1A] . . . BLX[NA], BLX[1B] . . . BLX[NB], BLW[1A] . . . BLW[NA], or BLW[1B] . . . BLW[NB] corresponding to a bit line of bit lines 114[1] . . . 114[C], discussed above with respect to FIG. 1. In the embodiment depicted in FIG. 3, a given memory cell 112 is coupled with a single bit line of bit lines BLX[1A] . . . BLX[NA], BLX[1B] . . . BLX[NB], BLW[1A] . . . BLW[NA], or BLW[1B] . . . BLW[NB]. In some embodiments, a given memory cell 112 is coupled with a pair of bit lines of bit lines BLX[1A] . . . BLX[NA], BLX[1B] . . . BLX[NB], BLW[1A] . . . BLW[NA], or BLW[1B] . . . BLW[NB].

In the embodiment depicted in FIG. 3, each one of memory array segments 310X[1] . . . 310X[N] and 310W[1] . . . 310W[N] includes two columns of memory cells 112. In various embodiments, one or more of memory array segments 310X[1] . . . 310X[N] or 310W[1] . . . 310W[N] includes one or greater than two columns of memory cells 112.

In the embodiment depicted in FIG. 3, each one of memory array segments 310X[1] . . . 310X[N] and 310W[1] . . . 310W[N] includes a same number of columns of memory cells 112. In some embodiments, one or more of memory array segments 310X[1] . . . 310X[N] includes a first number of columns of memory cells 112 and one or more of memory array segments 310W[1] . . . 310W[N] includes a second number of columns of memory cells 112 different from the first number of columns of memory cells 112.

Memory array segments 310X[1] . . . 310X[N] and 310W[1] . . . 310W[N] are positioned such that each memory array segment 310X[n] is adjacent to a corresponding memory array segment 310W[n].

A given row of memory cells 112 thereby includes a first subset of memory cells 112 in memory array segments 310X[1] . . . 310X[N] alternating with a second subset of memory cells 112 in memory array segments 310W[1] . . . 310W[N]. The first subset of memory cells 112 of a given row m is coupled with one of word lines 316X[m], and the second subset of memory cells 112 of the given row m is coupled with one of word lines 316W[m].

In some embodiments, a given row m of memory cells 112 includes a memory cell 412X coupled with a word line 316X[m] and a memory cell 412W coupled with a word line 316W[m], discussed below with respect to FIG. 4.

Row decode circuit 320 is configured to output word line signals WX[1] . . . WX[M] corresponding to the first subset of memory cells 112 on word lines 316X[1] . . . 316X[M], and to output word line signals WW[1] . . . WW[M] corresponding to the second subset of memory cells 112 on word lines 316W[1] . . . 316W[M].

Row decode circuit 320 is thereby configured to, during a read or write operation, select the first subset of memory cells 112 of a row m by generating word line signal WX[m] on the corresponding word line 316X[m], and/or to select the second subset of memory cells 112 of the row m by generating word line signal WW[m] on the corresponding word line 316W[m].

Because write circuit 130 is configured to generate the voltage levels on bit lines BLX[1A] . . . BLX[NA], BLX[1B] . . . BLX[NB], BLW[1A] . . . BLW[NA], and BLW[113] . . . BLW[NB] based on data IN received at input port 100-I, memory circuit 300 is thereby configured, in a write operation, to write a first subset of data IN to memory array segments 310X[1] . . . 310X[N], write a second subset of data IN to memory array segments 310W[1] . . . 310W[N], or write an entirety of data IN to memory array segments 310X[1] . . . 310X[N] and 310W[1] . . . 310W[N].

Read circuit 350 includes a plurality of sense amplifiers SA coupled with bit lines BLX[1A] . . . BLX[NA], BLX[1B] . . . BLX[NB], BLW[1A] . . . BLW[NA], and BLW[113] . . . BLW[NB] through a plurality of selection circuits SEL. In the embodiment depicted in FIG. 3, a given sense amplifier SA is coupled with a pair of bit lines of bit lines BLX[1A] . . . BLX[NA], BLX[1B] . . . BLX[NB], BLW[1A] . . . BLW[NA], or BLW[113] . . . BLW[NB] through a corresponding selection circuit SEL.

In some embodiments, read circuit does not include a plurality of selection circuits SEL, and a given sense amplifier SA is coupled with a single bit line of bit lines BLX[1A] . . . BLX[NA], BLX[1B] . . . BLX[NB], BLW[1A] . . . BLW[NA], or BLW[113] . . . BLW[NB]. In some embodiments, a given sense amplifier SA is coupled with greater than two bit lines of bit lines BLX[1A] . . . BLX[NA], BLX[1B] . . . BLX[NB], BLW[1A] . . . BLW [NA], or BLW[113] . . . BLW[NB] through a corresponding selection circuit SEL.

In some embodiments, a selection circuit SEL includes a multiplexer. In some embodiments, read circuit 350 does not include a selection circuit SEL, and each one of memory array segments 310X[1] . . . 310X[N] and/or 310W[1] . . . 310W[N] includes a selection circuit SEL.

Each sense amplifier SA is an electronic circuit configured to determine the logical state of a corresponding selected memory cell 112 during a read operation. A first subset of sense amplifiers SA is coupled with the first subsets of the rows of memory cells 112 corresponding to memory array segments 310X[1] . . . 310X[N], and a second subset of sense amplifiers SA is coupled with the second subsets of the rows of memory cells 112 corresponding to memory array segments 310W[1] . . . 310W[N].

The first subset of sense amplifiers SA is configured to generate data signals X[1] . . . X[N] having voltage levels based on the logical states of the corresponding selected memory cells 112 during a read operation, and the second subset of sense amplifiers SA is configured to generate data signals W[1] . . . W[N] having voltage levels based on the logical states of the corresponding selected memory cells 112 during a read operation.

In some embodiments, each sense amplifier SA of the first subset of sense amplifiers SA includes a latch circuit configured to generate data signals X[1] . . . X[N] having latched voltage levels. In some embodiments, each sense amplifier SA of the second subset of sense amplifiers SA includes a latch circuit configured to generate data signals W[1] . . . W[N] having latched voltage levels.

Operation circuit 370A includes the number N of logic units 372. An nth logic unit 372 is configured to receive a pair of data signals X[n] and W[n], perform one or more logic or mathematical operations based on the voltage levels of data signals X[n] and W[n], and generate a signal R[n] of signals R[1] . . . R[N] having a voltage level representing a result of the one or more logic or mathematical operations.

In various embodiments, the nth logic unit 372 is configured to perform the one or more logic or mathematical operations based solely on data signals X[n] and W[n], or to perform the one or more logic or mathematical operations based on one or more data signals (not shown) in addition to data signals X[n] and W[n].

In various embodiments, logic units 372 are configured to perform one or more of an OR, NOR, XOR, AND, NAND, or multiplication operation, or one or more other operations suitable for processing two or more data bits.

In some embodiments, each logic unit 372 is configured to perform a same logic or mathematical operation. In various embodiments, at least one logic unit 372 is configured to perform a logic or mathematical operation different from one or more logic or mathematical operations performed by one or more other logic units 372.

In some embodiments, each logic unit 372 is configured to perform a same logic or mathematical operation during all operations. In various embodiments, at least one logic unit 372 is configurable so as to perform at least one logic or mathematical operation of a plurality of varying logic or mathematical operations responsive to one or more received signals (not shown).

By the configuration discussed above, memory circuit 300 is capable of performing an in-memory computation by coordinating read circuit 350 generating data signals X[n] and W[n] with operation circuit 170A performing one or more logical and/or mathematical operations on data signals X[n] and W[n].

By the configuration discussed above, operation circuit 370A is capable of performing multiple logic and/or mathematical operations on data stored in memory cells 112 by operating on data in memory array segments 310X[1] . . . 310X[N] separately from data in respective memory array segments 310W[1] . . . 310W[N].

In some embodiments, memory circuit 300 is configured to, in an in-memory computing operation, use a first sense amplifier SA to generate a latched one of data signals X[n] or W[n], use a corresponding second sense amplifier SA to dynamically generate the other one of data signals X[n] or W[n] by sequentially selecting memory cells 112 from multiple rows in a given column, and use an nth logic unit 372 to repeatedly perform a given logic or mathematical operation to generate signal R[n]. Memory circuit 300 is configured to sequentially select memory cells 112 from multiple rows in a given column by generating either word line signal WX[m] on a word line 316X[m] or word line signal WW[m] on a word line 316W[m] while changing values of m.

In various embodiments, memory circuit 300 is configured to, in an in-memory computing operation, sequentially select memory cells 112 by stepping values of m from 1 through M, from M through 1, from 1 to a value less than M, from M to a value greater than 1, or using another order to change values of m within the span of 1 through M.

In some embodiments, memory circuit 300 is configured such that, in an in-memory computing operation, operation circuit 370A repeats the nth logic unit 372 repeatedly performing the given logic or mathematical operation to generate signal R[n] for multiple values of n.

In various embodiments, memory circuit 300 is configured to, in an in-memory computing operation, generate signal R[n] for multiple values of n by using each value of n from 1 through N or by using a subset of values of n from within the span of 1 through N. In various embodiments, memory circuit 300 is configured to, in an in-memory computing operation, generate signal R[n] for multiple values of n by using multiple logic units 372 in parallel, in series, or in a combination of parallel and series operation.

In some embodiments, memory circuit 300 is configured to perform a non-limiting example of an in-memory computing operation discussed below with respect to FIG. 5.

Addition circuit 370B is configured to receive signals R[1] . . . R[N], perform an addition operation based on the results represented by the voltage levels of signals R[1] . . . R[N], generate data OUT, and output data OUT on output port 100-O.

In some embodiments, addition circuit 370B is configured to perform the addition operation by adding each of the results of an nth logic unit 372 repeatedly performing the given logic or mathematical operation represented by signal R[n] for each signal R[n] of signals R[1] ... R[N]. In various embodiments, addition circuit 370B is configured to perform the addition operation by adding one or more subsets of the results of the nth logic unit 372 repeatedly performing the given logic or mathematical operation represented by signal R[n] for each signal R[n] of signals R[1] ... R[N].

In various embodiments, addition circuit 370B is configured to generate data OUT having N data bits, fewer than N data bits, or greater than N data bits.

By the configuration discussed above, memory circuit 300 is capable of performing a series of in-memory computing operations, e.g., a matrix computation, based on data in memory array segments 310X[1] ... 310X[N] separate from data in respective memory array segments 310W[1] ... 310W[N]. A memory circuit 100, system 200A, or network circuit 200B including memory circuit 300 is thereby capable of realizing the benefits discussed above with respect to memory circuit 100, system 200A, and network circuit 200B.

In embodiments in which memory circuit 300 is configured to dynamically generate one of data signals X[n] or W[n] by sequentially selecting memory cells 112 from multiple rows in a given column with the other of data signals X[n] or W[n] latched, memory circuit 300 enables reduced power and simplified circuit configurations compared to approaches in which a memory circuit does not dynamically generate a first data signal with a second data signal.

Figure 4:
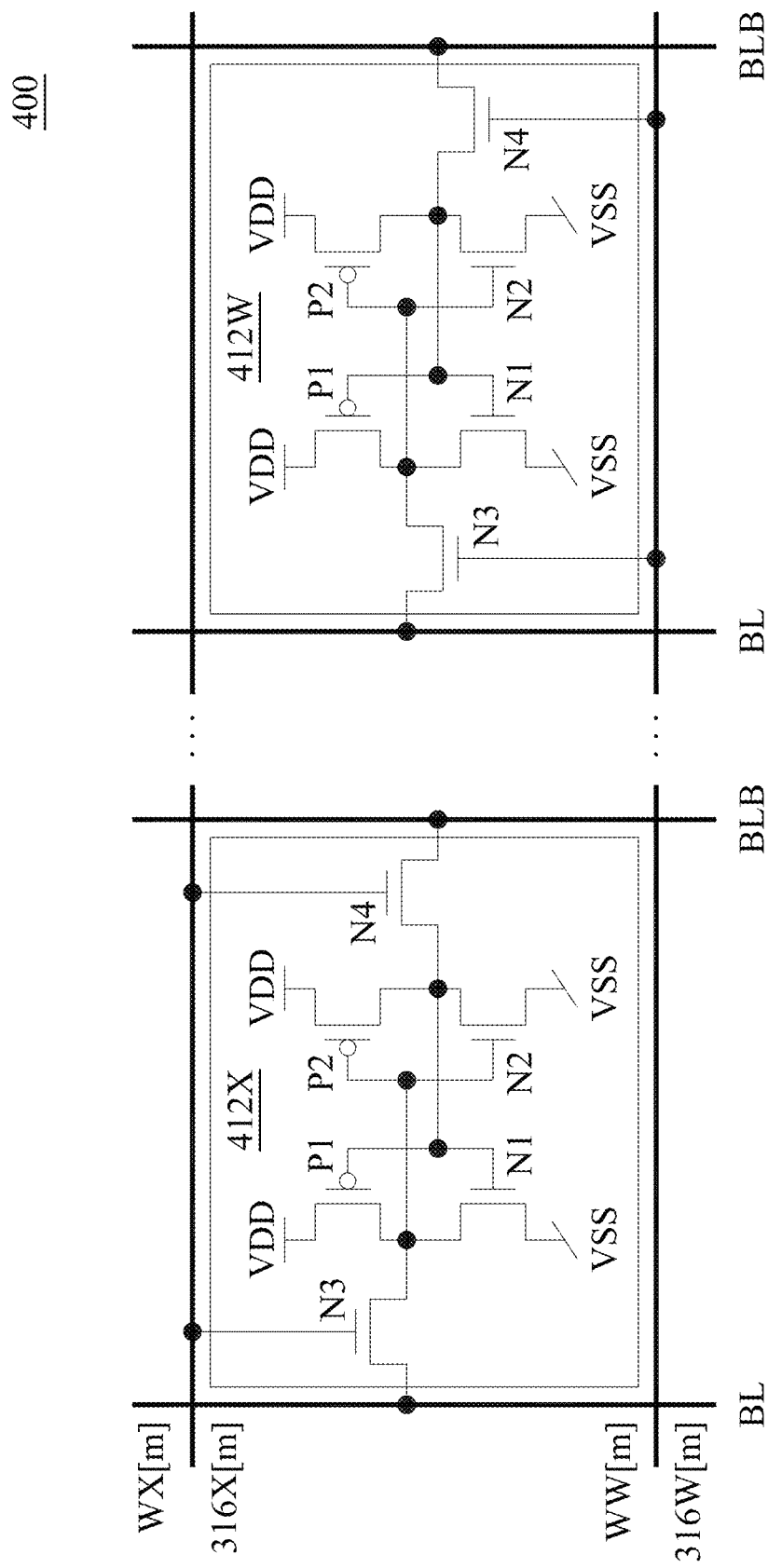
FIG. 4 is a diagram of a memory cell circuit, in accordance with some embodiments.

FIG. 4 is a diagram of a memory cell circuit 400, in accordance with some embodiments. Memory cell circuit 400 is usable as a portion of a memory circuit 100 or 300, discussed above with respect to FIGS. 1 and 3.

Memory cell circuit 400 includes word line 316X[m] configured to carry word line signal WX[m] and word line 316W[m] configured to carry word line signal WW[m], discussed above with respect to FIG. 3. Memory cell circuit 400 also includes memory cells 412X and 412W, each usable as a memory cell 112, and bit lines BL and BLB, each usable as a bit line of bit lines 114[1] ... 114[C], each discussed above with respect to FIG. 1.

FIG. 4 depicts memory cell circuit 400 including one each of memory cells 412X and 412W for the purpose of illustration. In various embodiments, memory cell circuit 400 includes greater than one each of one or both of memory cells 412X and 412W.

Each one of memory cells 412X and 412W is configured as a 6T SRAM cell by including power nodes VDD and VSS, PMOS transistors P1 and P2, and NMOS transistors N1, N2, N3, and N4, in which each pair of transistor pairs P1 and N1, and P2 and N2, is configured as an inverter coupled between power nodes VDD and VSS.

Gates of transistors P2 and N2 are coupled together, to drain terminals of transistors P1 and N1, and to one of a source or drain terminal of transistor N3. The other of the source or drain terminal of transistor N3 is coupled with bit line BL.

Gates of transistors P1 and N1 are coupled together, to drain terminals of transistors P2 and N2, and to one of a source or drain terminal of transistor N4. The other of the source or drain terminal of transistor N4 is coupled with complementary bit line BLB. Transistor pairs P1 and N1, and P2 and N2, are thereby cross-coupled and configured to be selectively coupled with bit lines BL and BLB through respective transistors N3 and N4.

Memory cell 412X includes the gates of transistors N3 and N4 coupled with word line 316X[m], and is thereby configured to be coupled with bit lines BL and BLB responsive to word line signal WX[m]. Memory cell 412W includes the gates of transistors N3 and N4 coupled with word line 316W[m], and is thereby configured to be coupled with bit lines BL and BLB responsive to word line signal WW[m].

Memory cell circuit 400 is thereby configured to selectively activate one or both of memory cells 412X or 412W in a read or write operation. A memory circuit 100 or 300 including memory cell circuit 400 is thereby capable of realizing the benefits discussed above with respect to memory circuit 100, system 200A, and network circuit 200B.

Figure 5:
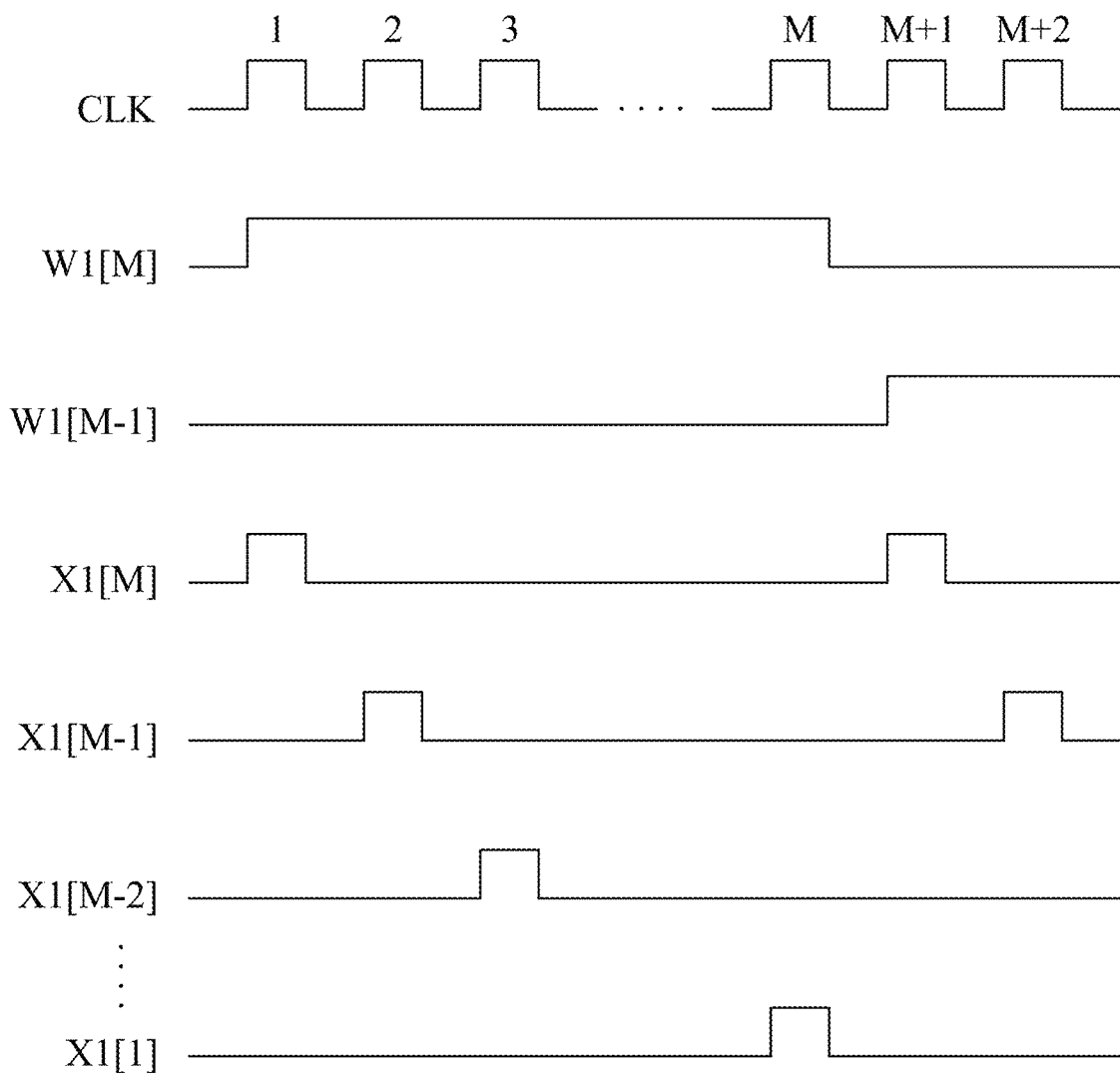
FIG. 5 is a plot of memory circuit operating parameters, in accordance with some embodiments.

FIG. 5 is a plot of memory circuit operating parameters, in accordance with some embodiments. FIG. 5 depicts a non-limiting example of an in-memory computing operation in which a data signal W1[m] is latched while a data signal X1[m] is dynamically generated by stepping from m=M to m=1 based on a clock signal CLK. Data signals W1[m] and X1[m] are non-limiting examples of respective data signals W[n] and X[n], discussed above with respect to FIG. 3, for a case in which n=1.

For the purpose of illustration, data signals W1[m] and X1[m] include pulses that do not indicate a particular logic state determined by a sense amplifier SA. Instead, the data signal pulses indicate that a sense amplifier SA is actively outputting a data signal W1[m] or X1[m] based on any determined logic state of a selected memory cell 112. Clock signal CLK includes pulses that indicate step numbers.

Data signal W1[M] is active from step 1 though step M, illustrating that the corresponding sense amplifier SA is outputting data signal W1[M] latched to a voltage level indicating a logic state of the memory cell 112 in row M of a given column in memory array segment 310W[1].

Data signal W1[M−1] is active from step M+1 though step 2M (not shown), illustrating that the corresponding sense amplifier SA is outputting data signal W1[M−1] latched to a voltage level indicating a logic state of the memory cell 112 in row M−1 of the given column in memory array segment 310W[1].

Data signal X1[M] is active during steps 1 and M+1, illustrating that the corresponding sense amplifier SA is outputting data signal X1[M] at a voltage level indicating a logic state of the memory cell 112 in row M of a given column in memory array segment 310X[1] only during a first step in a sequence of M steps.

Data signal X1[M−1] is active during steps 2 and M+2, illustrating that the corresponding sense amplifier SA is outputting data signal X1[M−1] at a voltage level indicating a logic state of the memory cell 112 in row M−1 of the given column in memory array segment 310X[1] only during a second step in the sequence of M steps.

Data signal X1[M−2] is active during steps 3 and M+3 (not shown), illustrating that the corresponding sense amplifier SA is outputting data signal X1[M−2] at a voltage level indicating a logic state of the memory cell 112 in row M−2 of the given column in memory array segment 310X[1] only during a third step in the sequence of M steps.

Data signal X1[1] is active during steps M and 2M, illustrating that the corresponding sense amplifier SA is outputting data signal X1[1] at a voltage level indicating a logic state of the memory cell 112 in row 1 of the given column in memory array segment 310X[1] only during the Mth step in the sequence of M steps.

Steps 1 through M correspond to a first portion of a matrix computation in which a given logic operation is repeatedly performed, e.g., using operation circuit 370A discussed above with respect to FIG. 3, by combining latched data signal W1[M] with data signals X1[M] through X1[1] sequentially selected at each step. Similarly, steps M+1 through 2M correspond to a second portion of the matrix computation in which the given logic operation is repeatedly performed by combining latched data signal W1[M−1] with data signals X1[M] through X1[1] sequentially selected at each step. Additional portions of the matric computation correspond to combining each of latched data signals W1[M-2] through W1[1] with data signals X1[M] through X1[1] sequentially selected at corresponding steps.

To complete the matrix computation, the results of each logic operation performed on the combination of data signals W[1] . . . [M] and X[1] . . . X[M] are summed, e.g., using addition circuit 370B discussed above with respect to FIG. 3.

In some embodiments, data signals W[M−2] through W[1] correspond to weight data, and data signals X[M] through X[1] correspond to input data of a multiply-accumulate operation.

In some embodiments, for cases in which n>1, steps 1 through M are repeated for each value of m and n, thereby resulting in the following matrix multiplication operation:

$$1^{st}\text{cycle} \begin{bmatrix} \begin{bmatrix} X1[M] & X2[M] & \ldots & Xn[M] \\ X1[M-1] & X2[M-1] & & Xn[M-1] \\ \vdots & & \ddots & \vdots \\ X1[2] & X2[2] & & Xn[2] \\ X1[1] & X2[1] & \cdots & Xn[1] \end{bmatrix} \end{bmatrix} \quad [1]$$

$$\begin{bmatrix} \begin{bmatrix} W1[M] & W2[M] & \ldots & Wn[M] \\ W1[M-1] & W2[M-1] & & Wn[M-1] \\ \vdots & & \ddots & \vdots \\ W1[2] & W2[2] & & Wn[2] \\ W1[1] & X2[1] & \cdots & Wn[1] \end{bmatrix} \end{bmatrix}$$

The output OUT of the matrix multiplication operation is represented by the equation:

$$\text{OUT} = \sum_{i=0}^{n} X_i \cdot W_i \quad [2]$$

wherein Xi represents data signals Xi[1] through Xi[M] and Wi represents data signals Wi[1] through Wi[M].

A memory circuit 100 or 300 configured to perform an in-memory computing operation in accordance with the non-limiting example depicted in FIG. 5 is capable of operating one memory array segment separately from at least one other memory array segment and is thereby capable of realizing the benefits discussed above with respect to memory circuit 100, system 200A, and network circuit 200B.

FIG. 6 is a flowchart of a method 600 of performing an in-memory computation, in accordance with one or more embodiments. Method 600 is usable with a memory circuit, e.g., memory circuit 100 discussed above with respect to FIG. 1, a system, e.g., system 200A discussed above with respect to FIG. 2A, or a network circuit, e.g., network circuit 200B discussed above with respect to FIG. 2B.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6.

In some embodiments, some or all of the operations of method 600 are a subset of operations of a method of performing a memory circuit or network, e.g., neural network, computation. In some embodiments, some or all of the operations of method 600 are used to perform an in-memory computing operation in accordance with the non-limiting example depicted in FIG. 5.

At operation 610, in some embodiments, input data is received at an input port of a memory circuit. The memory circuit includes a memory array positioned between the input port and an output port, a write circuit positioned between the input port and the memory array, and a read circuit positioned between the memory array and the output port.

In some embodiments, receiving the input data at the input port includes receiving input data IN at input port 100-I, discussed above with respect to FIG. 1.

In some embodiments, receiving the input data at the input port includes receiving data from an output port of another memory circuit. In some embodiments, receiving the input data at the input port includes receiving data at one of memory circuits 100-2 through 100-L from an adjacent one of memory circuits 100-1 through 100-(L−1), discussed above with respect to FIG. 2.

At operation 620, in some embodiments, a first subset of the input data is stored in a first segment of the memory array and a second subset of the input data is stored in a second segment of the memory array. In some embodiments, storing the first subset in the first segment and the second subset in the second segment includes storing input data in one of the first or second segments and weight data in the other of the first or second segments.

Storing the first subset of the input data in the first segment and the second subset in the second segment includes storing the first and second subsets using the write circuit separate from the read circuit. In some embodiments, storing the first and second subsets includes using the write circuit at a first end of the columns of the memory array opposite a second end of the columns of the memory array at which the read circuit is positioned. In some embodiments, storing the first and second subsets includes using write circuit 130, discussed above with respect to FIGS. 1 and 3.

In some embodiments, storing the first subset in the first segment includes storing the first subset in one of memory array segments 310X[1] . . . 310X[N], and storing the second subset in the second segment includes storing the second subset in one of memory array segments 310W[1] . . . 310W[N], discussed above with respect to FIG. 3.

At operation 630, in some embodiments, a first data bit from a first column of memory cells in one of the first segment of the memory array or the second segment of the memory array is latched. In some embodiments, latching the first data bit includes latching a weight bit of weight data. In some embodiments, latching the first data bit includes latching an input bit of input data.

In some embodiments, latching the first data bit includes latching the first data bit with a sense amplifier of the read circuit. In some embodiments, latching the first data bit includes selecting the first column using a selection circuit, e.g., a multiplexer. In some embodiments, latching the first data bit includes latching one of data signals X[n] or W[n], discussed above with respect to FIG. 3.

At operation 640, in some embodiments, a plurality of second data bits from a second column of memory cells in the other of the first segment or the second segment is sequentially read. In some embodiments, sequentially reading the second data bits includes sequentially reading input data bits of input data. In some embodiments, sequentially reading the second data bits includes sequentially reading weight data bits of weight data.

In some embodiments, sequentially reading the second data bits includes sequentially reading the second data bits with a sense amplifier of the read circuit. In some embodiments, sequentially reading the second data bits includes selecting the second column using a selection circuit, e.g., a multiplexer. In some embodiments, sequentially reading the second data bits includes sequentially reading one of data signals X[n] or W[n], discussed above with respect to FIG. 3.

At operation 650, in some embodiments, a logic operation is performed on each combination of the latched first data bit and each second data bit of the plurality of second data bits. In various embodiments, performing the logic operation includes one or more of performing an OR, NOR, XOR, AND, NAND, or multiplication operation, or one or more other operations suitable for processing at least two data bits. In some embodiments, performing the logic operation includes combining a weight data bit with an input data bit.

Performing the logic operation includes using a logic circuit. In some embodiments, performing the logic operation includes using computation circuit 170, discussed above with respect to FIG. 1. In some embodiments, performing the logic operation includes using a logic unit 372, discussed above with respect to FIG. 3.

At operation 660, in some embodiments, one or more or all of operations 630 through 650 are repeated. In some embodiments, repeating one or more or all of operations 630 through 650 includes latching a third data bit from the first column of memory cells, sequentially reading the plurality of second data bits from the second column of memory cells, and performing the logic operation on each combination of the latched third data bit and each second data bit of the plurality of second data bits.

In some embodiments, repeating one or more or all of operations 630 through 650 includes repeating the operations of latching a given data bit, sequentially reading a corresponding plurality of data bits, and performing the logic operation on the resultant combinations for a plurality of columns in respective first and second memory array segments. In some embodiments, the respective first and second memory array segments are memory array segments 310W[1] . . . 310W[N] and 310X[1] . . . 310X[N], discussed above with respect to FIG. 3.

At operation 670, in some embodiments, a sum is calculated by adding some or all of the results of performing the logic operation on each combination of each latched data bit and each sequentially read data bit. In some embodiments, calculating the sum is part of performing a matrix computation. In some embodiments, calculating the sum is part of performing a matrix combination of weight and input data.

Calculating the sum includes using an addition circuit. In some embodiments, calculating the sum includes using computation circuit 170, discussed above with respect to FIG. 1. In some embodiments, calculating the sum includes using addition circuit 370B, discussed above with respect to FIG. 3.

At operation 680, in some embodiments, the sum is output by the memory circuit. Outputting the sum includes outputting the sum at the output port of the memory circuit. In some embodiments, outputting the sum includes outputting the sum at output port OUT, discussed above with respect to FIG. 1.

At operation 690, in some embodiments, the sum is included in an input to a layer of a network circuit. In some embodiments, including the sum in an input includes including the sum in an input to an input port of another memory circuit. In some embodiments, including the sum in an input includes including the sum in an input to one of memory circuits 100-2 through 100-(L−1), discussed above with respect to FIG. 2.

In some embodiments, including the sum in an input includes including the sum in an input to a layer of a neural network computation.

By executing some or all the operations of method 600, some or all of an in-memory computation is performed, thereby obtaining the benefits discussed above with respect to memory circuit 100, system 200A, and network circuit 200B.

In some embodiments, a memory circuit includes a first memory array comprising first memory cells wherein a plurality of first word lines is coupled with a plurality of rows of first memory cells in a first segment of the first memory array and a plurality of second word lines is coupled with the plurality of rows of first memory cells in a second segment of the first memory array; a read circuit configured to retrieve data from the first memory cells of the first memory array; a computation circuit configured to perform a matrix computation by combining first data retrieved from the first memory cells of the first segment with second data retrieved from the first memory cells of the second segment.

In some embodiments, the memory circuit further includes a sense amplifier comprising a latch circuit coupled with a first column of the first memory cells of the first segment, wherein the computation circuit is configured to perform the matrix computation by sequentially combining a data bit of the first data stored in the latch circuit with the second data retrieved from a second column of the first memory cells of the second segment.

In some embodiments, the plurality of first word lines is coupled with the first column; and the plurality of second word lines is coupled with a second column of the first memory cells of the first segment, wherein, during the matrix computation, the memory circuit is configured to sequentially activate the plurality of second word lines.

In some embodiments, the first segment comprises a plurality of first columns of memory cells configured to store the first data, the second segment comprises a plurality of second columns of memory cells configured to store the second data, and the plurality of first columns of memory cells is adjacent to the plurality of second columns of memory cells.

In some embodiments, each first word line of the plurality of first word lines is coupled with a memory cell of each first column of the plurality of first columns of memory cells; and each second word line of the plurality of second word lines is coupled with a memory cell of each second column of the plurality of second columns of memory cells.

In some embodiments, a number of first columns of the plurality of first columns of memory cells is equal to a number of second columns of the plurality of second columns of memory cells.

In some embodiments, each of the first memory cells of the first segment of the first memory cells and the second segment is a static random-access memory (SRAM) cell.

In some embodiments, the memory circuit further includes a write circuit configured to store the combined first data and second data.

In some embodiments, a memory circuit includes a first memory array comprising first memory cells wherein a plurality of first word lines is coupled with a plurality of rows of first memory cells in a first segment of the first memory array and a plurality of second word lines is coupled with the plurality of rows of first memory cells in a second segment of the first memory array; a read circuit configured to retrieve data from the first memory cells of the first memory array; and a computation circuit configured to perform one or more logic operations of a matrix computation on the retrieved data, wherein the retrieved data is retrieved from the first memory cells of the first memory array, and the computation circuit is configured to output result data that includes accumulated sum data based on the one or more logic operations of the matrix computation.

In some embodiments, the computation circuit is configured to coordinate the read circuit performing one or more read operations with the computation circuit performing the one or more logic operations.

In some embodiments, the memory circuit further includes a second memory array having second memory cells, wherein the first memory array includes an output terminal and the second memory array is connected to the output terminal.

In some embodiments, the computation circuit is configured to perform the matrix computation by combining a first subset of the retrieved data from the first segment of the first memory array with a second subset of the retrieved data from the second segment.

In some embodiments, the read circuit comprises a latch circuit coupled with a first column of the first memory cells in one of the first segment or the second segment, and the computation circuit is configured to perform the matrix computation by sequentially combining a data bit stored in the latch circuit with a plurality of data bits retrieved from a second column of the first memory cells in the other of the first segment or the second segment.

In some embodiments, the accumulated sum data is provided in accordance with a formula $\Sigma_{i=0}^{n} Xi*Wi$, wherein Xi represents data signals Xi[1] through Xi[M] and Wi represents data signals Wi[1] through Wi[M], where M is an integer that represents a number of the plurality of rows.

In some embodiments, the memory circuit further includes a second memory array having second memory cells of the second memory array; a write circuit configured to store the accumulated sum data; an input port and an output port, wherein the first memory array is positioned between the input port and the output port, the write circuit is positioned between the input port and the first memory array, and the read circuit is positioned between the first memory array and the output port.

In some embodiments, the memory circuit further includes a second memory array having second memory cells of the second memory array; and a write circuit is configured to receive data from a second read circuit positioned between the write circuit and the second memory array.

In some embodiments, a memory circuit includes a first memory array comprising first memory cells wherein a plurality of first word lines is coupled with a plurality of rows of first memory cells in a first segment of the first memory array and a plurality of second word lines is coupled with the plurality of rows of first memory cells in a second segment of the first memory array; a second memory array that includes second memory cells; a read circuit configured to retrieve data from the first memory cells of the first memory array; a computation circuit configured to perform one or more logic operations of a matrix computation on the retrieved data, wherein the retrieved data is retrieved solely from the first memory cells of the first memory array, and the computation circuit is configured to output result data comprising accumulated sum data based on the one or more logic operations of the matrix computation; and a write circuit configured to store the accumulated sum data in the second memory cells of the second memory array.

In some embodiments, the memory circuit further includes a sense amplifier comprising a latch circuit coupled with a first column of the first memory cells of the first segment, wherein the computation circuit is configured to perform the matrix computation by sequentially combining a data bit of first data stored in the latch circuit with second data retrieved from a second column of the first memory cells of the second segment.

In some embodiments, the plurality of first word lines is coupled with the first column; and the plurality of second word lines is coupled with the second column of the first memory cells of the first segment, wherein during the matrix computation, the memory circuit is configured to sequentially activate the plurality of second word lines.

In some embodiments, the first segment comprises a plurality of first columns of memory cells configured to store first data, the second segment comprises a plurality of second columns of memory cells configured to store second data, and the plurality of first columns of memory cells is adjacent to the plurality of second columns of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a first memory array comprising:
      a plurality of first word lines coupled with first memory cells of a plurality of rows of first and second memory cells, the first memory cells being included in a first segment of the first memory array; and
      a plurality of second word lines coupled with the second memory cells of the plurality of rows of first and second memory cells, the second memory cells being included in a second segment of the first memory array;
   a read circuit configured to retrieve data from the first and second memory cells of the first memory array; and a computation circuit configured to perform a matrix computation by combining first data retrieved from the first memory cells of the first segment with second data retrieved from the second memory cells of the second segment.

2. The memory circuit of claim 1, further comprising:
a sense amplifier comprising a latch circuit coupled with a first column of the first memory cells of the first segment, wherein:
the computation circuit is configured to perform the matrix computation by sequentially combining a data bit of the first data stored in the latch circuit with the second data retrieved from a second column of the second memory cells of the second segment.

3. The memory circuit of claim 2, wherein:
the plurality of first word lines is coupled with the first column; and
the plurality of second word lines is coupled with the second column of the second memory cells of the second segment, wherein, during the matrix computation, the memory circuit is configured to sequentially activate the plurality of second word lines.

4. The memory circuit of claim 1, wherein:
the first segment comprises a plurality of first columns of the first memory cells configured to store the first data;
the second segment comprises a plurality of second columns of the second memory cells configured to store the second data; and
the plurality of first columns of memory cells is adjacent to the plurality of second columns of memory cells.

5. The memory circuit of claim 4, wherein:
each first word line of the plurality of first word lines is coupled with a first memory cell of each first column of the plurality of first columns of the first memory cells; and
each second word line of the plurality of second word lines is coupled with a second memory cell of each second column of the plurality of second columns of the second memory cells.

6. The memory circuit of claim 4, wherein:
a number of first columns of the plurality of first columns of the first memory cells is equal to a number of second columns of the plurality of second columns of the second memory cells.

7. The memory circuit of claim 1, wherein:
each of the first memory cells of the first segment and the second memory cells of the second segment is a static random-access memory (SRAM) cell.

8. The memory circuit of claim 1, further comprising:
a write circuit configured to store the combined first data and second data.

9. A memory circuit comprising:
a first memory array comprising:
    a plurality of first word lines coupled with first memory cells of a plurality of rows of first and second memory cells, the first memory cells being included in a first segment of the first memory array; and
    a plurality of second word lines coupled with the second memory cells of the plurality of rows of first and second memory cells, the second memory cells being included in a second segment of the first memory array;
a read circuit configured to retrieve data from the first and second memory cells of the first memory array; and
a computation circuit configured to perform one or more logic operations of a matrix computation on the retrieved data, wherein the retrieved data is retrieved from the first and second memory cells of the first memory array, and
the computation circuit is configured to output result data that includes accumulated sum data based on the one or more logic operations of the matrix computation.

10. The memory circuit of claim 9, wherein:
the computation circuit is configured to coordinate the read circuit performing one or more read operations with the computation circuit performing the one or more logic operations.

11. The memory circuit of claim 9, further comprising:
a second memory array, wherein the first memory array includes an output terminal and the second memory array is connected to the output terminal.

12. The memory circuit of claim 9, wherein:
the computation circuit is configured to perform the matrix computation by combining a first subset of the retrieved data from the first segment of the first memory array with a second subset of the retrieved data from the second segment.

13. The memory circuit of claim 12, wherein:
the read circuit comprises a latch circuit coupled with a first column of the first memory cells in the first segment, and
the computation circuit is configured to perform the matrix computation by sequentially combining a data bit stored in the latch circuit with a plurality of data bits retrieved from a second column of the second memory cells in the second segment.

14. The memory circuit of claim 12, wherein:
the accumulated sum data is provided in accordance with a formula $\Sigma_{i=0}^{M} Xi*Wi$, wherein Xi represents data signals Xi[1] through Xi[M] and Wi represents data signals Wi[1] through Wi[M], where M is an integer that represents a number of the plurality of rows.

15. The memory circuit of claim 9, further comprising:
a second memory array;
a write circuit configured to store the accumulated sum data; and
an input port and an output port coupled with the second memory array, wherein
    the first memory array is positioned between the input port and the output port,
    the write circuit is positioned between the input port and the first memory array, and
    the read circuit is positioned between the first memory array and the output port.

16. The memory circuit of claim 9, further comprising:
a second memory array; and
a write circuit configured to receive data from a second read circuit positioned between the write circuit and the second memory array.

17. A memory circuit comprising:
a first memory array comprising:
    a plurality of first word lines coupled with first memory cells of a plurality of rows of first and second memory cells, the first memory cells being included in a first segment of the first memory array; and
    a plurality of second word lines coupled with the plurality of rows of first and second memory cells, the second memory cells being included in a second segment of the first memory array;
a second memory array comprising third memory cells;
a read circuit configured to retrieve data from the first and second memory cells of the first memory array;

a computation circuit configured to perform one or more logic operations of a matrix computation on the retrieved data, wherein
the retrieved data is retrieved solely from the first and second memory cells of the first memory array, and
the computation circuit is configured to output result data comprising accumulated sum data based on the one or more logic operations of the matrix computation; and
a write circuit configured to store the accumulated sum data in the third memory cells of the second memory array.

18. The memory circuit of claim 17, further comprising:
a sense amplifier comprising a latch circuit coupled with a first column of the first memory cells of the first segment, wherein:
the computation circuit is configured to perform the matrix computation by sequentially combining a data bit of first data stored in the latch circuit with second data retrieved from a second column of the second memory cells of the second segment.

19. The memory circuit of claim 18, wherein:
the plurality of first word lines is coupled with the first column; and
the plurality of second word lines is coupled with the second column of the second memory cells of the second segment, and
during the matrix computation, the memory circuit is configured to sequentially activate the plurality of second word lines.

20. The memory circuit of claim 17, wherein:
the first segment comprises a plurality of first columns of the first memory cells configured to store first data;
the second segment comprises a plurality of second columns of the second memory cells configured to store second data; and
the plurality of first columns of the first memory cells is adjacent to the plurality of second columns of the second memory cells.

* * * * *